(12) United States Patent
Jindal et al.

(10) Patent No.: US 11,762,278 B2
(45) Date of Patent: Sep. 19, 2023

(54) MULTILAYER EXTREME ULTRAVIOLET REFLECTORS

(71) Applicant: Applied Materials, Inc., Santa Clara, CA (US)

(72) Inventors: Vibhu Jindal, San Jose, CA (US); Herng Yau Yoong, Singapore (SG); Wen Xiao, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 343 days.

(21) Appl. No.: 17/349,177

(22) Filed: Jun. 16, 2021

(65) Prior Publication Data

US 2022/0404692 A1  Dec. 22, 2022

(51) Int. Cl.
*G03F 1/24* (2012.01)

(52) U.S. Cl.
CPC .................................. *G03F 1/24* (2013.01)

(58) Field of Classification Search
CPC .................................................. G03F 1/24
See application file for complete search history.

(56) References Cited

U.S. PATENT DOCUMENTS

| | | | |
|---|---|---|---|
| 4,410,407 | A | 10/1983 | Macaulay |
| 6,449,086 | B1 | 9/2002 | Singh |
| 10,209,411 | B2 | 2/2019 | Goehnermeier et al. |
| 10,481,484 | B2 | 11/2019 | Ikebe et al. |
| 2011/0168545 | A1 | 7/2011 | Shibamoto |
| 2016/0363855 | A1 | 12/2016 | Ha |
| 2017/0178877 | A1 | 6/2017 | Wang et al. |
| 2018/0291500 | A1 | 10/2018 | Wang et al. |
| 2020/0277698 | A1 | 9/2020 | Jindal et al. |
| 2020/0310244 | A1 | 10/2020 | Nakagawa et al. |
| 2021/0132487 | A1 | 5/2021 | Shin et al. |

FOREIGN PATENT DOCUMENTS

| | | |
|---|---|---|
| JP | 2001085332 A | 3/2001 |
| JP | 2008205376 A | 9/2008 |
| KR | 20080001023 A | 1/2008 |
| WO | 2020153228 A1 | 7/2020 |

OTHER PUBLICATIONS

PCT International Search Report and Written Opinion in PCT/US2022/033375 dated Oct. 6, 2022, 8 pages.
Machine Translation of JP2001085332, 13 pages.
Machine Translation of JP2008205376, 20 pages.
Wood, et al., Improved Ru/Si multilayer reflective coatings for advanced extreme ultraviolet lithography photomasks, BACUS News, Jun. 2016, vol. 32, Issue 6, 11 pages.
PCT International Search Report and Written Opinion in PCT/US2020/020031 dated Jun. 30, 2020, 12 pages.
Van Setten, Eelco, et al., Multilayer optimization for High-NA EUV Mask3D suppression, Proceedings of SPIE vol. 11517, EUVL (2020), available online only at SPIEDigitalLibrary.org/conference-proceedings-of-spie.

*Primary Examiner* — Christopher G Young
(74) *Attorney, Agent, or Firm* — Servilla Whitney LLC (57) ABSTRACT

Extreme ultraviolet (EUV) mask blanks, production systems therefor, and methods of reducing roughness are disclosed. The EUV mask blanks comprise a multilayer reflective stack on a substrate comprising a plurality of pairs of alternating layers comprising a first layer and a second layer, the first layer including a first element selected from the group consisting of Si, B, Al, Mg, Zr, Ba, Nb, Ti, Gd, Y, and Ca; and the second layer including a second element selected from the group consisting of Ru, Mo, Ta, Sb, Tc, Nb, Ir, Pt, and Pd. Some EUV mask blanks described herein include interface layer between the first layer and the second layer, the interface layer including an interface element selected from the group consisting of Si, B, C, Al, Mo, and Ru.

20 Claims, 6 Drawing Sheets

FIG. 6

MULTILAYER EXTREME ULTRAVIOLET REFLECTORS

TECHNICAL FIELD

The present disclosure generally relates to extreme ultraviolet lithography. More particularly, the disclosure relates to extreme ultraviolet mask blanks comprising a multilayer reflective stack having alternating layers of different materials and methods of reducing roughness of multilayer reflective stack.

BACKGROUND

Extreme ultraviolet (EUV) lithography is used for the manufacture of 0.0135 micron and smaller minimum feature size semiconductor devices. Through the use of a series of mirrors, or lens elements, and a reflective element, or mask blank, coated with a non-reflective absorber mask pattern, the patterned light is reflected onto a resist-coated semiconductor substrate.

Figure 1:
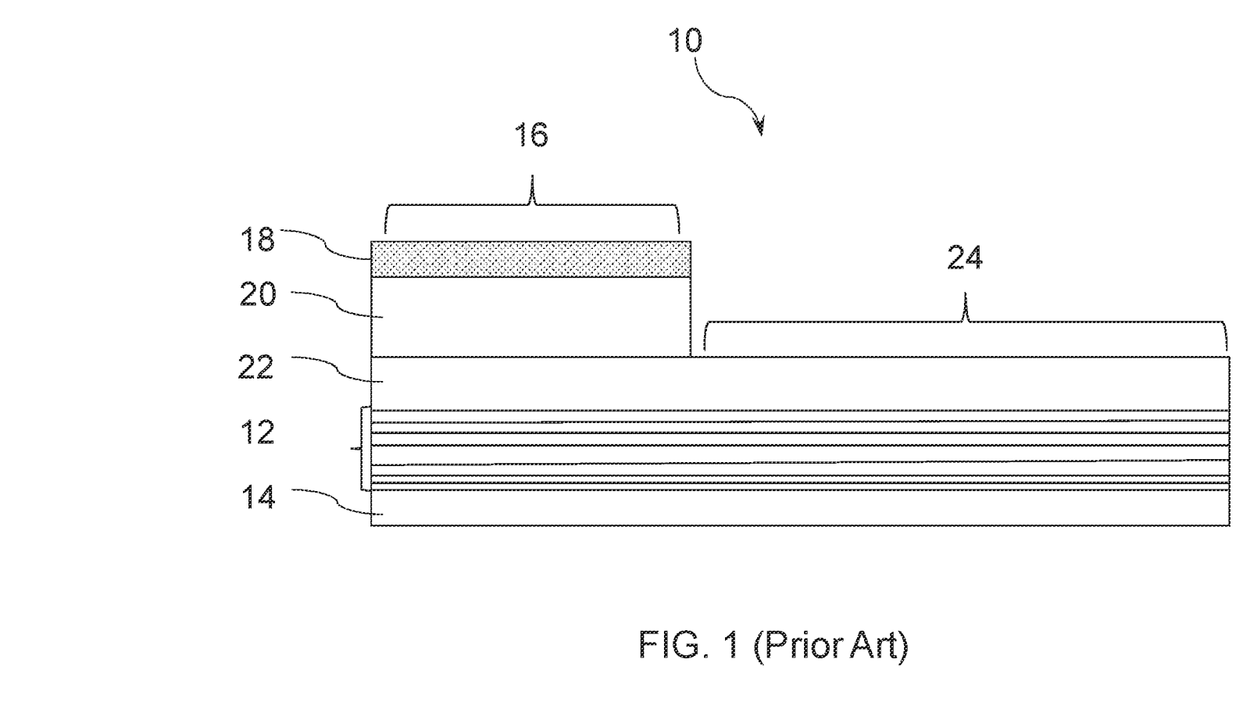
FIG. 1 schematically illustrates a background art EUV reflective mask employing a conventional absorber.

The lens elements and mask blanks of extreme ultraviolet lithography systems are coated with reflective multilayer coatings of materials such as molybdenum and silicon. FIG. 1 shows a conventional EUV reflective mask 10, which is formed from an EUV mask blank, which includes a reflective multilayer stack 12 on a substrate 14, which reflects EUV radiation at unmasked portions by Bragg interference. Masked (non-reflective) areas 16 of the conventional EUV reflective mask 10 are formed by etching buffer layer 18 and absorbing layer 20. A capping layer 22 is formed over the reflective multilayer stack 12 and protects the reflective multilayer stack 12 during the etching process. An etched mask blank has (non-reflective) areas 16 and reflective areas 24.

The effective mirror plane of the multilayer reflector is a distance away from the absorber due to light penetration into multilayer stack, which known as Z-effect ($Z_{eff}$). The $Z_{eff}$ causes phase change of reflected light and double diffraction of EUV light on patterned absorber. The double diffraction results in additional diffracted light falling inside numerical aperture of the reflector, and hence causes what is referred to as the mask 3D effect, such as non-telecentricity, edge placement error through focus, best focus variation through feature and contrast loss through fading.

There is a need to provide EUV mask blanks having multilayer reflective stacks having low $Z_{eff}$ and high reflectance over large bandwidth of reflection angle minimize the mask 3D effect, especially for high-NA EUV scanners. In addition, the multilayer reflective stack must meet other requirements for EUV mask blanks, including roughness, uniformity, stress and thermal stability.

SUMMARY

One or more embodiments of the disclosure are directed to an extreme ultraviolet (EUV) mask blank comprising a multilayer reflective stack on a substrate, the multilayer reflective stack comprising a plurality of pairs of alternating layers comprising a first layer and a second layer, the first layer including a first element selected from the group consisting of Si, B, Al, Mg, Zr, Ba, Nb, Ti, Gd, Y, and Ca; and the second layer including a second element selected from the group consisting of Ru, Mo, Ta, Sb, Tc, Nb, Ir, Pt, and Pd wherein the first layer comprises at least one of: an alloy of two or more of the first elements, a nitride of the first element, a carbide of the first element, an oxide of the first element, and a silicide of B, Al, Mg, Zr, Ba, Nb, Ti, Gd, Y, and Ca; or the second layer comprises at least one of an alloy of two or more of the second elements, a nitride of the second element, a carbide of the second element, an oxide of the second element, and a silicide of the second element; a capping layer on the multilayer reflective stack; and an absorber layer on the capping layer.

Additional embodiments are directed to an extreme ultraviolet (EUV) mask blank comprising a multilayer reflective stack on a substrate, the multilayer reflective stack comprising a plurality of pairs of alternating layers comprising a first layer and a second layer, the first layer including a first element selected from the group consisting of Si, B, Al, Mg, Zr, Ba, Nb, Ti, Gd, Y, and Ca; and the second layer including a second element selected from the group consisting of Ru, Mo, Ta, Sb, Tc, Nb, Ir, Pt, and Pd; an interface layer between the first layer and the second layer, the interface layer including an interface element selected from the group consisting of Si, B, C, Al, Mo, Ru, an alloy of the interface element, a nitride of the interface element, a carbide of the interface element, an oxide of the interface element, and a silicide of the interface element, wherein when the interface layer comprises Si and the first layer comprises Si, properties of the interface layer are different than properties of the first layer, and wherein the interface layer reduces roughness of the multilayer reflective stack compared to a multilayer reflective stack that does not include an interface layer between the first layer and the second layer; a capping layer on the multilayer reflective stack; and an absorber layer on the capping layer.

Further embodiments of the disclosure are directed to a method of reducing roughness of a multilayer reflective stack comprising forming multilayer reflective stack on a substrate, the multilayer reflective stack comprising a plurality of pairs of alternating layers comprising a first layer and a second layer, the first layer including a first element selected from the group consisting of Si, B, Al, Mg, Zr, Ba, Nb, Ti, Gd, Y, and Ca; and the second layer including a second element selected from the group consisting of Ru, Mo, Ta, Sb, Tc, Nb, Ir, Pt, and Pd; forming in at least one of the first layer and the second layer: at least one of an alloy of two or more of the first elements, a nitride of the first element, a carbide of the first element, an oxide of the first element, and a silicide of B, Al, Mg, Zr, Ba, Nb, Ti, Gd, Y and Ca; at least one of an alloy of two or more of the second elements, a nitride of the second element, a carbide of the second element, an oxide of the second element, and a silicide of the second element; forming a capping layer on the multilayer reflective stack; and forming an absorber layer on the capping layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that react with the substrate surface.

As used in this specification and the appended claims, the terms "reflective multilayer stack", "multilayer reflective stack", "multilayer stack of reflective layers" are used interchangeably to refer to a reflective element such as an EUV mask blank.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate means both a bare substrate and a substrate with one or more films or features deposited or formed thereon.

Figure 2:
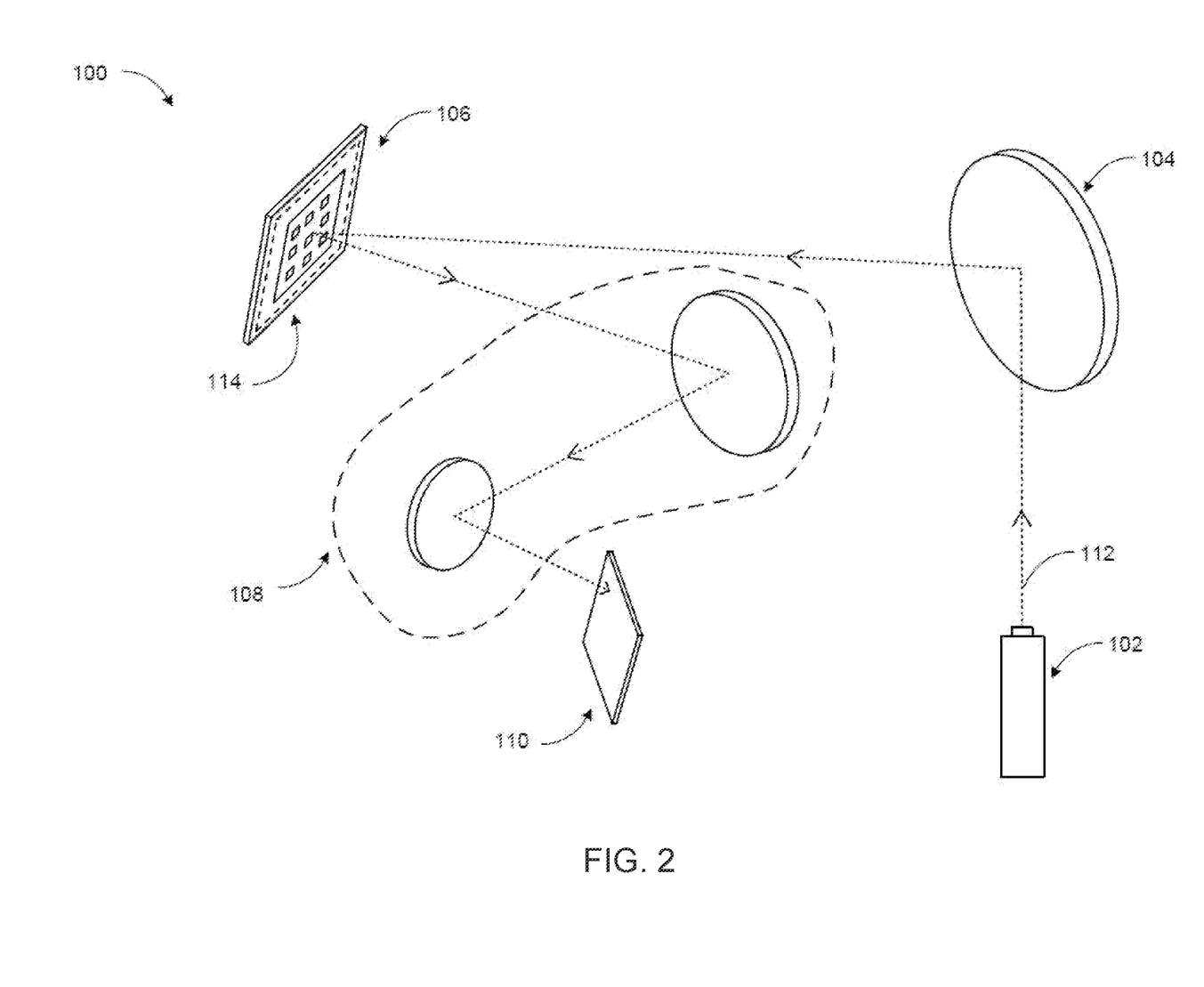
FIG. 2 schematically illustrates an embodiment of an extreme ultraviolet lithography system.

Referring now to FIG. 2, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target wafer 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nanometers (nm). For example, the extreme ultraviolet light source 102 includes a laser, a laser produced plasma, a discharge produced plasma, a free-electron laser, synchrotron radiation, or a combination thereof. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm.

In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106. Although the condenser 104 is shown as a single element, it is understood that the condenser 104 in some embodiments includes one or more reflective elements such as concave mirrors, convex mirrors, flat mirrors, or a combination thereof, for reflecting and concentrating the extreme ultraviolet light 112. For example, the condenser 104 in the embodiment shown is a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target wafer 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target wafer 110. The optical reduction assembly 108 of some embodiments includes mirrors and other optical elements to reduce the size of the image of the mask pattern 114. For example, the optical reduction assembly 108 in some embodiments includes concave mirrors for reflecting and focusing the extreme ultraviolet light 112.

The optical reduction assembly 108 reduces the size of the image of the mask pattern 114 on the target wafer 110. For example, the mask pattern 114 is imaged at a 4:1 ratio by the optical reduction assembly 108 on the target wafer 110 to form the circuitry represented by the mask pattern 114 on the target wafer 110. The extreme ultraviolet light 112 scans the EUV reflective mask 106 synchronously with the target wafer 110 to form the mask pattern 114 on the target wafer 110.

Figure 3:
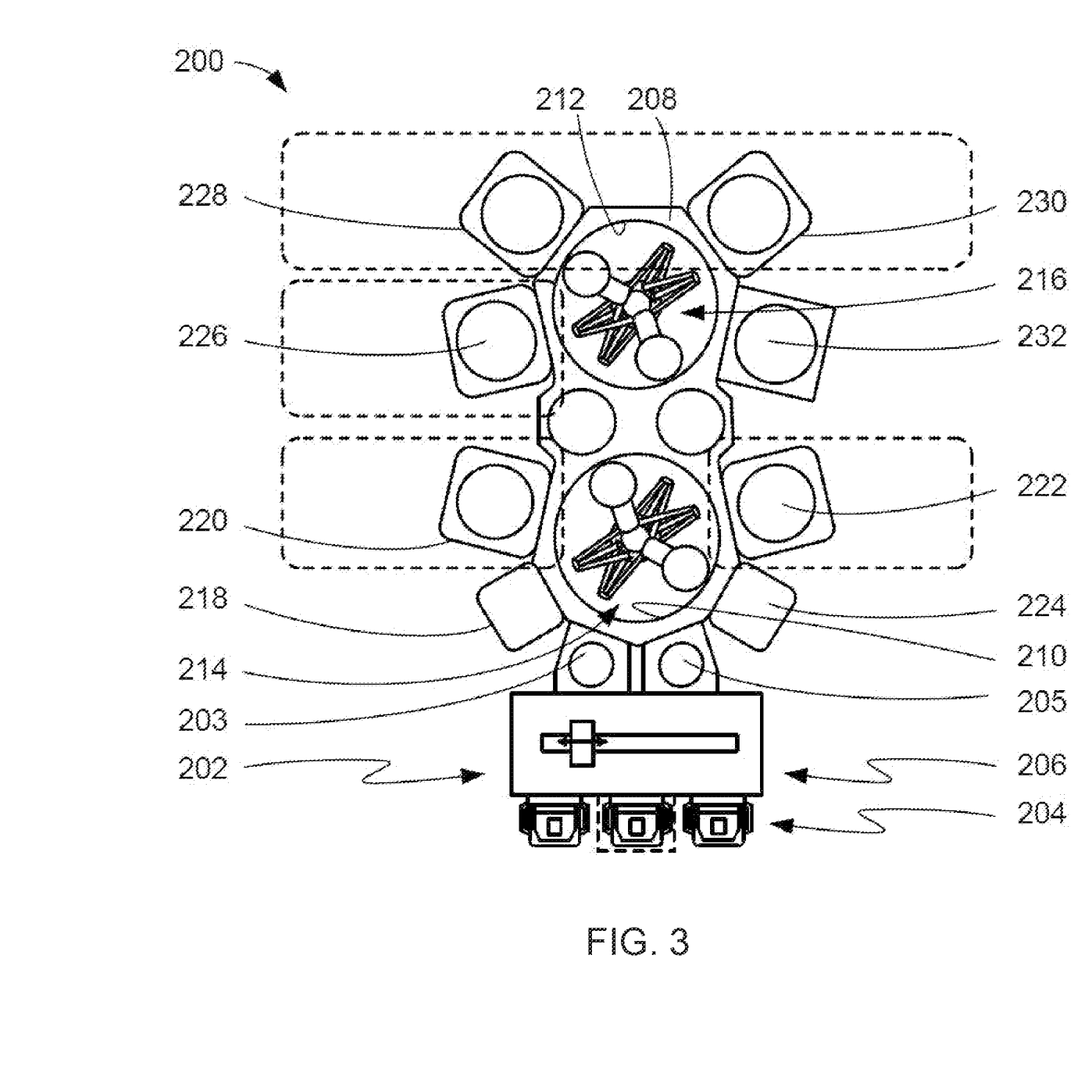
FIG. 3 illustrates an embodiment of an extreme ultraviolet reflective element production system.

Referring now to FIG. 3, an embodiment of an extreme ultraviolet reflective element production system 200 is shown. The extreme ultraviolet reflective element includes an EUV mask blank 204, an extreme ultraviolet mirror 205, or other reflective element such as an EUV reflective mask 106.

The extreme ultraviolet reflective element production system 200 produces mask blanks, mirrors, or other elements that reflect the extreme ultraviolet light 112 of FIG. 2. The extreme ultraviolet reflective element production system 200 fabricates the reflective elements by applying thin coatings to source substrates 203.

The EUV mask blank 204 is a multilayered structure for forming the EUV reflective mask 106 of FIG. 2. The EUV mask blank 204 is formed using semiconductor fabrication techniques. The EUV reflective mask 106 has the mask pattern 114 of FIG. 2 formed on the EUV mask blank 204 by etching and other processes.

The extreme ultraviolet mirror 205 is a multilayered structure reflective in a range of extreme ultraviolet light. The extreme ultraviolet mirror 205 is formed using semiconductor fabrication techniques. The EUV mask blank 204 and the extreme ultraviolet mirror 205 are, in some embodiments, similar structures with respect to the layers formed on each element, however, the extreme ultraviolet mirror 205 does not have the mask pattern 114.

The reflective elements are efficient reflectors of the extreme ultraviolet light 112. In an embodiment, the EUV mask blank 204 and the extreme ultraviolet mirror 205 has an extreme ultraviolet reflectivity of greater than 60%. The reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 includes substrate transport boxes, loadlocks, and other components to transfer a substrate from atmosphere to vacuum inside the system. Because the EUV mask blank 204 is used to form devices at a very small scale, the source substrates 203 and the EUV mask blank 204 are processed in a vacuum system to prevent contamination and other defects.

The wafer handling vacuum chamber 208 contains two vacuum chambers, a first vacuum chamber 210 and a second vacuum chamber 212. The first vacuum chamber 210 includes a first wafer handling system 214 and the second vacuum chamber 212 includes a second wafer handling system 216. Although the wafer handling vacuum chamber 208 is described with two vacuum chambers, it is understood that the system can have any number of vacuum chambers.

The wafer handling vacuum chamber 208 has a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, are used in some embodiments to form thin films of conductive materials on the source substrates 203. For example, the physical vapor deposition systems of some embodiments include a vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

In one or more embodiments, he physical vapor deposition system forms reflective layers, capping layers, and absorber layers. For example, the physical vapor deposition systems are configured to form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 of some embodiments includes a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 are in a separate system from the extreme ultraviolet reflective element production system 200.

The chemical vapor deposition system 228 forms thin films of material on the source substrates 203. For example, the chemical vapor deposition system 228 is used to form layers of materials on the source substrates 203 including mono-crystalline layers, polycrystalline layers, amorphous layers, epitaxial layers, or a combination thereof. The chemical vapor deposition system 228 forms layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system forms planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 transfers the source substrates 203 and the EUV mask blank 204 between the first wafer handling system 214, the second wafer handling system 216 in a continuous vacuum.

Figure 4:
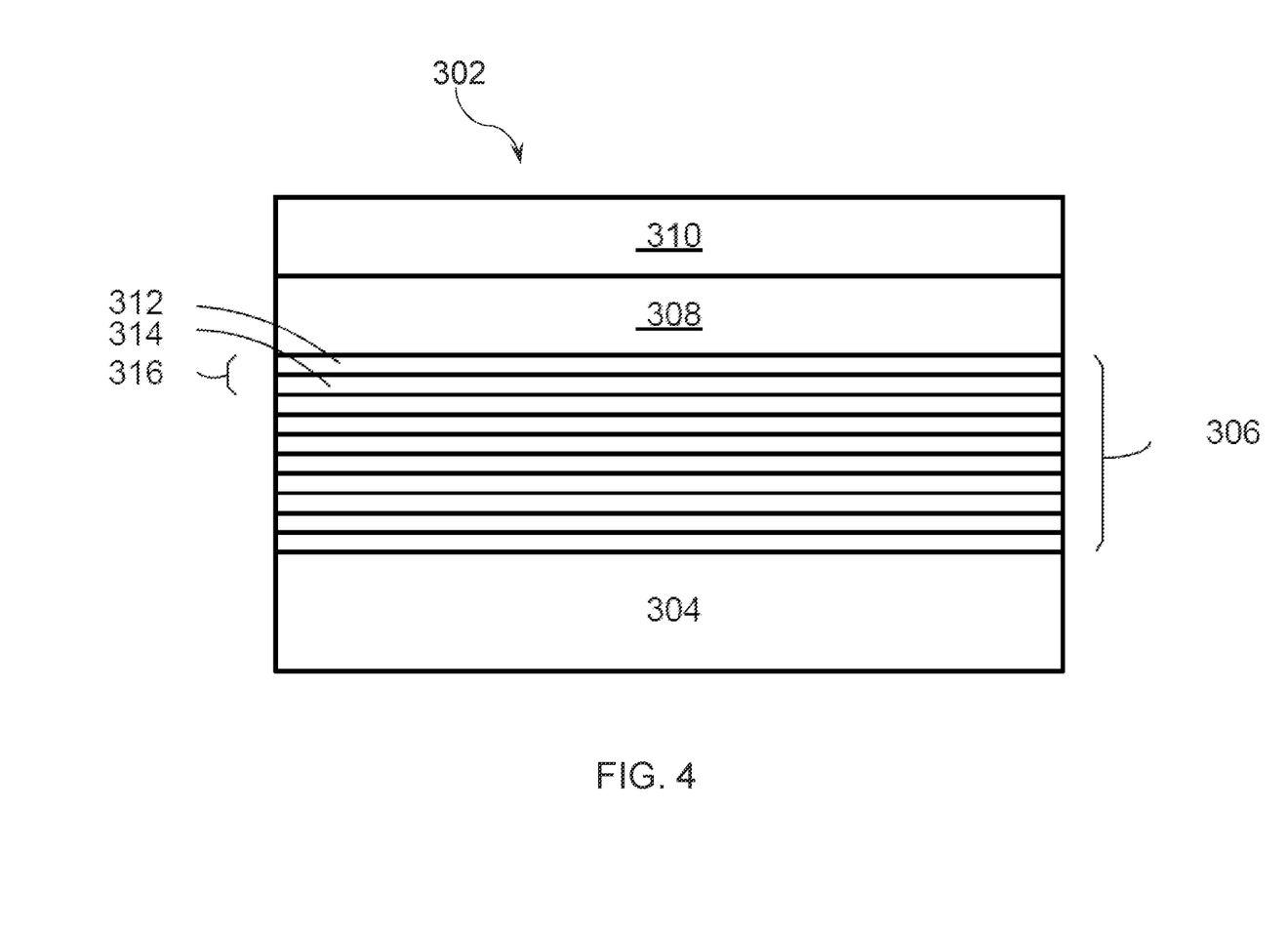
FIG. 4 illustrates an embodiment of an extreme ultraviolet reflective element such as an EUV mask blank.

Referring now to FIG. 4, an embodiment of an extreme ultraviolet reflective element 302 is shown. In one or more embodiments, the extreme ultraviolet reflective element 302 is the EUV mask blank 204 of FIG. 3 or the extreme ultraviolet mirror 205 of FIG. 3. The EUV mask blank 204 and the extreme ultraviolet mirror 205 are structures for reflecting the extreme ultraviolet light 112 of FIG. 2. The EUV mask blank 204 is used to form the EUV reflective mask 106 shown in FIG. 2.

The extreme ultraviolet reflective element 302 includes a substrate 304, a multilayer reflective stack 306, and a capping layer 308. In one or more embodiments, the extreme ultraviolet mirror 205 is used to form reflecting structures for use in the condenser 104 of FIG. 2 or the optical reduction assembly 108 of FIG. 2.

The extreme ultraviolet reflective element 302, which in some embodiments is an EUV mask blank 204, includes the substrate 304, the multilayer reflective stack 306, the capping layer 308, and an absorber layer 310 on the capping layer 308. The extreme ultraviolet reflective element 302, in some embodiments, is an EUV mask blank 204, which is used to form the EUV reflective mask 106 of FIG. 2 by patterning the absorber layer 310 with the layout of the circuitry required.

As used in this specification and the appended claims, the term for the EUV mask blank 204 is used interchangeably with the term of the extreme ultraviolet mirror 205 for simplicity. In one or more embodiments, the EUV mask blank 204 includes the components of the extreme ultraviolet mirror 205 with the absorber layer 310 added in addition to form the mask pattern 114 of FIG. 2.

The EUV mask blank 204 is an optically flat structure used for forming the EUV reflective mask 106 having the mask pattern 114. In one or more embodiments, the reflective surface of the EUV mask blank 204 forms a flat focal plane for reflecting the incident light, such as the extreme ultraviolet light 112 of FIG. 2.

The substrate 304 is an element for providing structural support to the extreme ultraviolet reflective element 302. In one or more embodiments, the substrate 304 is made from a material having a low coefficient of thermal expansion (CTE) to provide stability during temperature changes. In one or more embodiments, the substrate 304 has properties such as stability against mechanical cycling, thermal cycling, crystal formation, or a combination thereof. The substrate 304 according to one or more embodiments is formed from a material such as silicon, glass, oxides, ceramics, glass ceramics, or a combination thereof.

In one or more embodiments, the multilayer reflective stack 306 is a structure that is reflective to the extreme ultraviolet light 112. In one or more embodiments, he multilayer reflective stack 306 comprises a plurality of pairs of alternating layers comprising a first layer 312 and a second layer 314. The first layer 312 and the second layer 314 can have a variety of structures. In an embodiment, both the first layer 312 and the second layer 314 are formed with a single layer, multiple layers, a divided layer structure, non-uniform structures, or a combination thereof.

The first layer 312 and the second layer 314 are formed from a variety of materials. In one or more embodiments, the first layer 312 includes a first element selected from the group consisting of Si, B, Al, Mg, Zr, Ba, Nb, Ti, Gd, Y, and Ca. In one or more embodiments, the second layer 314 includes a second element selected from the group consisting of Ru, Mo, Ta, Sb, Tc, Nb, Ir, Pt, and Pd.

In one or more embodiments, the first layer 312 and the second layer 314 form a reflective pair 316. As used in this specification and the appended claims, the terms "reflective pair" and "plurality of pairs of alternating layers" may be used interchangeably to refer to one or more reflective layers. In a non-limiting embodiment, the multilayer reflective stack 306 includes a range of 20-60 of the reflective pairs 316 for a total of up to 120 reflective layers.

In one or more embodiments, the plurality of pairs of alternating layers 316 comprises the first layer 312 and the second layer 314 include the first layer 312 comprising at least one of a material selected from: an alloy of two or more of the first elements, a nitride of the first element, a carbide of the first element, an oxide of the first element, and a silicide of B, Al, Mg, Zr, Ba, Nb, Ti, Gd, Y, and Ca; or the second layer 314 comprises at least one of a material selected from: an alloy of two or more of the second elements, a nitride of the second element, a carbide of the second element, an oxide of the second element, and a silicide of the second element.

According to one or more embodiments, the material of the first layer 312 and the material of the second layer 314 have a relatively large difference in refractive index n, for example, n of the material of the first layer 312 (high-n) can be 0.94-1.01 and n of the material of the second layer 314 (low-n) can be 0.87-0.92, to form interfaces with high EUV reflection. In one or more embodiments, both the materials of the first layer 312 and the second layer 314 have low extinction coefficient (e.g., k<0.03) to minimize EUV absorption by the multilayers.

In one or more embodiments, forming an alloy in the first layer 312 and/or in the second layer 314 results in reduced roughness of the first layer 312 and/or in the second layer 314. Alloyed and/or nitridated layers reduce roughness of the first layer 312 and/or the second layer 314, which results in both large bandwidth and high reflection of EUV light, according to one or more embodiments.

Figure 5:
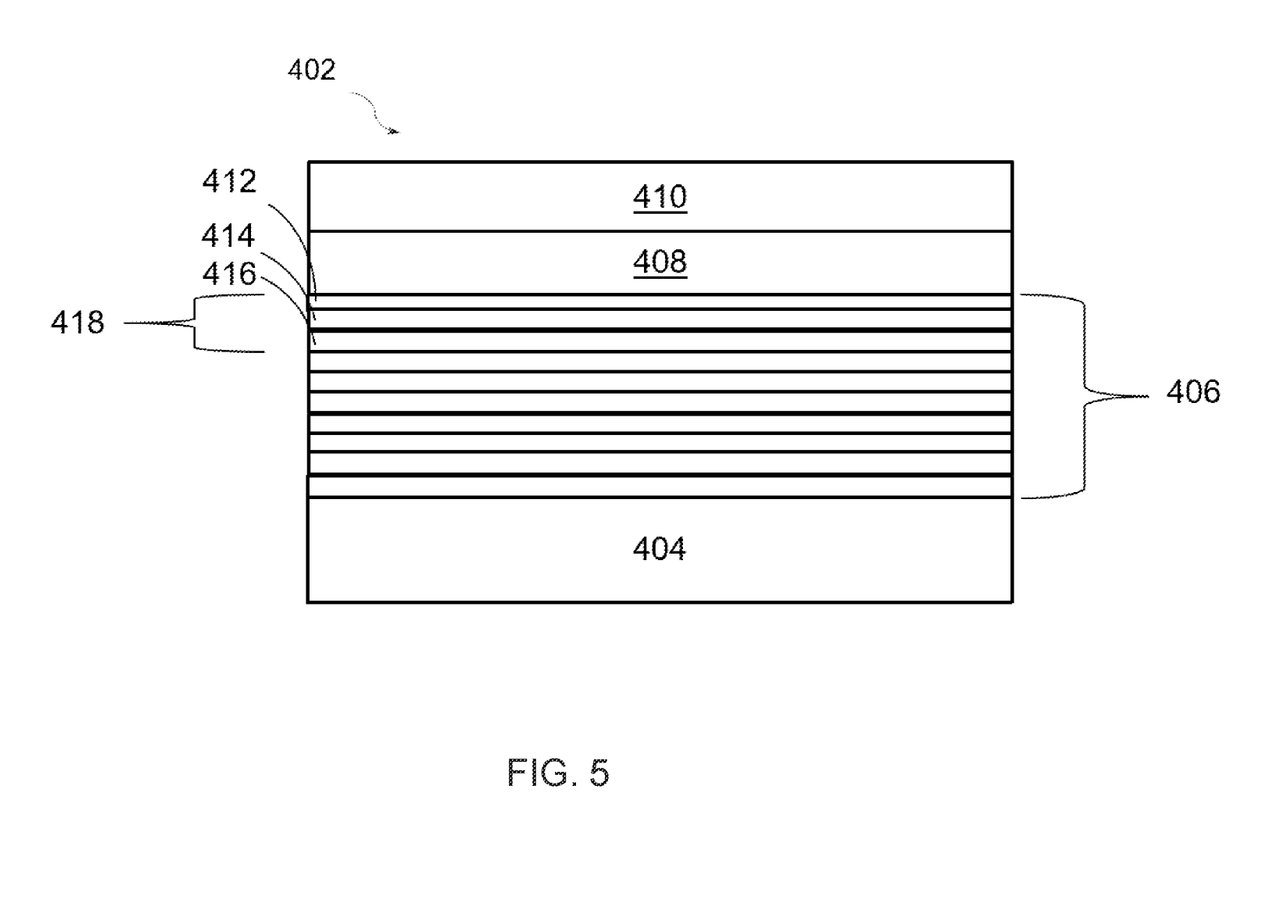
FIG. 5 illustrates an embodiment of an extreme ultraviolet reflective element such as an EUV mask blank.

Referring now to FIGS. 4 and 5, in one or more embodiments, each of the alloy of the two or more first elements and the alloy of the two or more second elements has a general formula of $A_xB_y$ comprising two elements where the sum of x and y is equal to 1. In one or more embodiments, the general formula of $A_xB_y$ includes one or more of $A_{0.1}B_{0.9}$, $A_{0.2}B_{0.8}$, $A_{0.3}B_{0.7}$, $A_{0.4}B_{0.6}$, $A_{0.5}B_{0.5}$, $A_{0.6}B_{0.4}$, $A_{0.7}B_{0.3}$, $A_{0.8}B_{0.2}$, and $A_{0.9}B_{0.1}$. In one or more embodiments, x is from 0.5 to 0.98. In one or more embodiments, x is from 0.5 to 0.98, y is from 0.02 to 0.5.

Examples of the alloy of the two or more first elements have the general formula of $A_xB_y$ comprising two elements include, but are not limited to, one or more of $Si_xN_y$, $Si_xC_y$, $Si_xO_y$, $B_xN_y$, $B_xC_y$, $B_xO_y$, $Al_xN_y$, $Al_xC_y$, $Al_xO_y$, $Mg_xN_y$, $Mg_xC_y$, $Mg_xO_y$, $Zr_xN_y$, $Zr_xC_y$, $Zr_xO_y$, $Ba_xN_y$, $Ba_xC_y$, $Ba_xO_y$, $Nb_xN_y$, $Nb_xC_y$, $Nb_xO_y$, $Ti_xN_y$, $Ti_xC_y$, $Ti_xO_y$, $Gd_xN_y$, $Gd_xC_y$, $Gd_xO_y$, $Y_xN_y$, $Y_xC_y$, $Y_xO_y$, $Ca_xN_y$, $Ca_xC_y$, $CaO_xO_y$, $Si_xB_y$, $Si_xAl_y$, $Si_xMg_y$, $Si_xZr_y$, $Si_xBa_y$, $Si_xNb_y$, $Si_xTi_y$, $Si_xGd_y$, $Si_xY_y$, $Si_xCa_y$, $B_xAl_y$, $B_xMg_y$, $B_xZr_y$, $B_xBa_y$, $B_xNb_y$, $B_xTi_y$, $B_xGd_y$, $B_xY_y$, $B_xCa_y$, $Al_xMg_y$, $Al_xZr_y$, $Al_xBa_y$, $Al_xNb_y$, $Al_xTi_y$, $Al_xGd_y$, $Al_xY_y$, $Al_xCa_y$, $Mg_xZr_y$, $Mg_xBa_y$, $Mg_xNb_y$, $Mg_xTi_y$, $Mg_xGd_y$, $Mg_xY_y$, $Mg_xCa_y$, $Zr_xBa_y$, $Zr_xNb_y$, $Zr_xTi_y$, $Zr_xGd_y$, $Zr_xY_y$, $Zr_xCa_y$, $Ba_xNb_y$, $Ba_xTi_y$, $Ba_xGd_y$, $Ba_xY_y$, $Ba_xCa_y$, $Nb_xTi_y$, $Nb_xGd_y$, $Nb_xY_y$, $Nb_xCa_y$, $Ti_xGd_y$, $Ti_xY_y$, $Ti_xCa_y$, $Gd_xY_y$, $Gd_xCa_y$, $Y_xCa_y$, and any variations thereof. In one or more embodiments, the alloy of the two or more first elements includes other compounds having the general formula of $A_xB_y$ comprising two elements.

Examples of the alloy of the two or more second elements having the general formula of $A_xB_y$ comprising two elements include, but are not limited to, one or more of $Ru_xSi_y$, $Ru_xN_y$, $Ru_xC_y$, $Ru_xO_y$, $Ru_xMo_y$, $Ru_xTa_y$, $Ru_xSb_y$, $Ru_xTc_y$, $Ru_xNb_y$, $Ru_xIr_y$, $Ru_xPt_y$, $Ru_xPd_y$, $Mo_xSi_y$, $Mo_xN_y$, $Mo_xC_y$, $Mo_xO_y$, $Mo_xTa_y$, $Mo_xSb_y$, $Mo_xTc_y$, $Ta_xSi_y$, $Ta_xN_y$, $Ta_xC_y$, $Ta_xO_y$, $Ta_xSb_y$, $Ta_xTc_y$, $Sb_xSi_y$, $Sb_xN_y$, $Sb_xC_y$, $Sb_xO_y$, $Tc_xSi_y$, $Tc_xN_y$, $Tc_xC_y$, $Tc_xO_y$, $Nb_xSi_y$, $Nb_xN_y$, $Nb_xC_y$, $Nb_xO_y$, $Ir_xSi_y$, $Ir_xN_y$, $Ir_xC_y$, $Ir_xO_y$, $Pt_xSi_y$, $Pt_xN_y$, $Pt_xC_y$, $Pt_xO_y$, $Pd_xSi_y$, $Pd_xN_y$, $Pd_xC_y$, $Pd_xO_y$, and any variations thereof. In one or more embodiments, the alloy of the two or more second elements includes other compounds having the general formula of $A_xB_y$ comprising two elements.

In one or more embodiments, the alloy of the two or more first elements have the general formula of $A_xB_y$ comprising two elements and the alloy of the two or more second elements have the general formula of $A_xB_y$ comprising two elements may form alloys including one or more first elements and one or more second elements.

In one or more embodiments, each of the alloy of the two or more first elements and the alloy of the two or more second elements has a general formula of $A_xB_y$ comprising two elements have a bond strength between the two or more first elements and the two or more second elements. In one or more embodiments, the bond strength is at least 250 kJ. In one or more embodiments, the bond strength is at least 200 kJ, at least 150 kJ, at least 100 kJ or at least 50 kJ.

In one or more embodiments, each of the alloy of the two or more first elements and the alloy of the two or more second elements has a general formula of $A_xB_yC_z$ comprising three elements where the sum of x, y, and z is equal to 1. In one or more embodiments, the general formula of $A_xB_yC_z$ includes one or more of, $A_{0.1}B_{0.45}C_{0.45}$, $A_{0.2}B_{0.4}C_{0.4}$, $A_{0.3}B_{0.35}C_{0.35}$, $A_{0.4}B_{0.3}C_{0.3}$, $A_{0.5}B_{0.25}C_{0.25}$, $A_{0.6}B_{0.2}C_{0.2}$, $A_{0.7}B_{0.2}C_{0.1}$, $A_{0.8}B_{0.1}C_{0.1}$, $A_{0.9}B_{0.05}C_{0.05}$, $A_{0.45}B_{0.1}C_{0.45}$, $A_{0.4}B_{0.2}C_{0.4}$, $A_{0.35}B_{0.3}C_{0.35}$, $A_{0.3}B_{0.4}C_{0.3}$, $A_{0.25}B_{0.5}C_{0.25}$, $A_{0.2}B_{0.6}C_{0.2}$, $A_{0.2}B_{0.7}C_{0.1}$, $A_{0.1}B_{0.8}C_{0.1}$, $A_{0.05}B_{0.9}C_{0.05}$, $A_{0.45}B_{0.45}C_{0.1}$, $A_{0.4}B_{0.4}C_{0.2}$, $A_{0.35}B_{0.35}C_{0.3}$, $A_{0.3}B_{0.3}C_{0.4}$, $A_{0.25}B_{0.25}C_{0.5}$, $A_{0.2}B_{0.2}C_{0.6}$, $A_{0.1}B_{0.2}C_{0.7}$, $A_{0.1}B_{0.1}C_{0.8}$, $A_{0.05}B_{0.05}C_{0.9}$. In one or more embodiments, x is from 0.5 to 0.98. In one or more embodiments, x is from 0.5 to 0.98, y is from 0.02 to 0.5.

In one or more embodiments, examples of the alloy of the two or more first elements having the general formula of $A_xB_yC_z$ comprising three elements include, but are not limited to one or more of $Si_xB_yN_z$, $Si_xB_yC_z$, $Si_xB_yO_z$, $Si_xAl_yN_z$, $Si_xAl_yC_z$, $Si_xAl_yO_z$, $Si_xMg_yN_z$, $Si_xMg_yC_z$, $Si_xMg_yO_z$, $Si_xZr_yN_z$, $Si_xZr_yC_z$, $Si_xZr_yO_z$, $Si_xBa_yN_z$, $Si_xBa_yC_z$, $Si_xBa_yO_z$, $Si_xNb_yN_z$, $Si_xNb_yC_z$, $Si_xNb_yO_z$, $Si_xTi_yN_z$, $Si_xTi_yC_z$, $Si_xTi_yO_z$, $Si_xGd_yN_z$, $Si_xGd_yC_z$, $Si_xGd_yO_z$, $Si_xY_yN_z$, $Si_xY_yC_z$, $Si_xY_yO_z$, $Si_xCa_yN_z$, $Si_xCa_yC_z$, $Si_xCa_yO_z$, $B_xAl_ySi_z$, $B_xAl_yN_z$, $B_xAl_yC_z$, $B_xAl_yO_z$, $B_xMg_ySi_z$, $B_xMg_yN_z$, $B_xMg_yC_z$, $B_xMg_yO_z$, $B_xZr_ySi_z$, $B_xZr_yN_z$, $B_xZr_yC_z$, $B_xZr_yO_z$, $B_xBa_ySi_z$, $B_xBa_yN_z$, $B_xBa_yC_z$, $B_xBa_yO_z$, $B_xNb_ySi_z$, $B_xNb_yN_z$, $B_xNb_yC_z$, $B_xNb_yO_z$, $B_xTi_ySi_z$, $B_xTi_yN_z$, $B_xTi_yC_z$, $B_xTi_yO_z$, $B_xGd_ySi_z$, $B_xGd_yN_z$, $B_xGd_yC_z$, $B_xGd_yO_z$, $B_xY_ySi_z$, $B_xY_yN_z$, $B_xY_yC_z$, $B_xY_yO_z$, $B_xCa_ySi_z$, $B_xCa_yN_z$, $B_xCa_yC_z$, $B_xCa_yO_z$, $Al_xMg_ySi_z$, $Al_xMg_yN_z$, $Al_xMg_yC_z$, $Al_xMg_yO_z$, $Al_xZr_ySi_z$, $Al_xZr_yN_z$, $Al_xZr_yC_z$, $Al_xZr_yO_z$, $Al_xBa_ySi_z$, $Al_xBa_yN_z$, $Al_xBa_yC_z$, $Al_xBa_yO_z$, $Al_xNb_ySi_z$, $Al_xNb_yN_z$, $Al_xNb_yC_z$, $Al_xNb_yO_z$, $Al_xTi_ySi_z$, $Al_xTi_yN_z$, $Al_xTi_yC_z$, $Al_xTi_yO_z$, $Al_xGd_ySi_z$, $Al_xGd_yN_z$, $Al_xGd_yC_z$, $Al_xGd_yO_z$, $Al_xY_ySi_z$, $Al_xY_yN_z$, $Al_xY_yC_z$, $Al_xY_yO_z$, $Al_xCa_ySi_z$, $Al_xCa_yN_z$, $Al_xCa_yC_z$, $Al_xCa_yO_z$, $Mg_xZr_ySi_z$, $Mg_xZr_yN_z$, $Mg_xZr_yC_z$, $Mg_xZr_yO_z$, $Mg_xBa_ySi_z$, $Mg_xBa_yN_z$, $Mg_xBa_yC_z$, $Mg_xBa_yO_z$, $Mg_xNb_ySi_z$, $Mg_xNb_yN_z$, $Mg_xNb_yC_z$, $Mg_xNb_yO_z$, $Mg_xTi_ySi_z$, $Mg_xTi_yN_z$, $Mg_xTi_yC_z$, $Mg_xTi_yO_z$, $Mg_xGd_ySi_z$, $Mg_xGd_yN_z$, $Mg_xGd_yC_z$, $Mg_xGd_yO_z$, $Mg_xY_ySi_z$, $Mg_xY_yN_z$, $Mg_xY_yC_z$, $Mg_xY_yO_z$, $Mg_xCa_ySi_z$, $Mg_xCa_yN_z$, $Mg_xCa_yC_z$, $Mg_xCa_yO_z$, $Zr_xBa_ySi_z$, $Zr_xBa_yN_z$, $Zr_xBa_yC_z$, $Zr_xBa_yO_z$, $Zr_xNb_ySi_z$, $Zr_xNb_yN_z$, $Zr_xNb_yC_z$, $Zr_xNb_yO_z$, $Zr_xTi_ySi_z$, $Zr_xTi_yN_z$, $Zr_xTi_yC_z$, $Zr_xTi_yO_z$, $Zr_xGd_ySi_z$, $Zr_xGd_yN_z$, $Zr_xGd_yC_z$, $Zr_xGd_yO_z$, $Zr_xY_ySi_z$, $Zr_xY_yN_z$, $Zr_xY_yC_z$, $Zr_xY_yO_z$, $Zr_xCa_ySi_z$, $Zr_xCa_yN_z$, $Zr_xCa_yC_z$, $Zr_xCa_yO_z$, $Ba_xNb_ySi_z$, $Ba_xNb_yN_z$, $Ba_xNb_yC_z$, $Ba_xNb_yO_z$, $Ba_xTi_ySi_z$, $Ba_xTi_yN_z$, $Ba_xTi_yC_z$, $Ba_xTi_yO_z$, $Ba_xGd_ySi_z$, $Ba_xGd_yN_z$, $Ba_xGd_yC_z$, $Ba_xGd_yO_z$, $Ba_xY_ySi_z$, $Ba_xY_yN_z$, $Ba_xY_yC_z$, $Ba_xY_yO_z$, $Ba_xCa_ySi_z$, $Ba_xCa_yN_z$, $Ba_xCa_yC_z$, $Ba_xCa_yO_z$, $Nb_xTi_ySi_z$, $Nb_xTi_yN_z$, $Nb_xTi_yC_z$, $Nb_xTi_yO_z$, $Nb_xGd_ySi_z$, $Nb_xGd_yN_z$, $Nb_xGd_yC_z$, $Nb_xGd_yO_z$, $Nb_xY_ySi_z$, $Nb_xY_yN_z$, $Nb_xY_yC_z$, $Nb_xY_yO_z$, $Nb_xCa_ySi_z$, $Nb_xCa_yN_z$, $Nb_xCa_yC_z$, $Nb_xCa_yO_z$, $Ti_xGd_ySi_z$, $Ti_xGd_yN_z$, $Ti_xGd_yC_z$, $Ti_xGd_yO_z$, $Ti_xY_ySi_z$, $Ti_xY_yN_z$, $Ti_xY_yC_z$, $Ti_xY_yO_z$, $Ti_xCa_ySi_z$, $Ti_xCa_yN_z$, $Ti_xCa_yC_z$, $Ti_xCa_yO_z$, $Gd_xY_ySi_z$, $Gd_xY_yN_z$, $Gd_xY_yC_z$, $Gd_xY_yO_z$, $Gd_xCa_ySi_z$, $Gd_xCa_yN_z$, $Gd_xCa_yC_z$, $Gd_xCa_yO_z$, $Y_xCa_ySi_z$, $Y_xCa_yN_z$, $Y_xCa_yC_z$, $Y_xCa_yO_z$, and any variations thereof. In one or more embodiments, the alloy of the two or more first elements includes other compounds having the general formula of $A_xB_yC_z$ comprising three elements.

In one or more embodiments, examples of the alloy of the two or more second elements having the general formula of $A_xB_yC_z$ comprising three elements include, but are not limited to, one or more of $Ru_xMo_ySi_z$, $Ru_xMo_yN_z$, $Ru_xMo_yC_z$, $Ru_xMo_yO_z$, $Ru_xTa_ySi_z$, $Ru_xTa_yN_z$, $Ru_xTa_yC_z$, $Ru_xTa_yO_z$, $Ru_xSb_ySi_z$, $Ru_xSb_yN_z$, $Ru_xSb_yC_z$, $Ru_xSb_yO_z$, $Ru_xTc_ySi_z$, $Ru_xTc_yN_z$, $Ru_xTc_yC_z$, $Ru_xTc_yO_z$, $Mo_xTa_ySi_z$, $Mo_xTa_yN_z$, $Mo_xTa_yC_z$, $Mo_xTa_yO_z$, $Mo_xSb_ySi_z$, $Mo_xSb_yN_z$, $Mo_xSb_yC_z$, $Mo_xSb_yO_z$, $Mo_xTc_ySi_z$, $Mo_xTc_yN_z$, $Mo_xTc_yC_z$, $Mo_xTc_yO_z$, $Ta_xSb_ySi_z$, $Ta_xSb_yN_z$, $Ta_xSb_yC_z$, $Ta_xSb_yO_z$, $Ta_xTc_ySi_z$, $Ta_xTc_yN_z$, $Ta_xTc_yC_z$, $Ta_xTc_yO_z$, $Sb_xTc_ySi_z$, $Sb_xTc_yN_z$, $Sb_xTc_yO_z$, $Nb_xMo_ySi_z$, $Nb_xMo_yN_z$, $Nb_xMo_yC_z$, $Nb_xMo_yO_z$, $Nb_xTa_ySi_z$, $Nb_xTa_yN_z$, $Nb_xTa_yC_z$, $Nb_xTa_yO_z$, $Nb_xSb_ySi_z$, $Nb_xSb_yN_z$, $Nb_xSb_yC_z$, $Nb_xSb_yO_z$, $Nb_xTc_ySi_z$, $Nb_xTc_yN_z$, $Nb_xTc_yC_z$, $Nb_xTc_yO_z$, $Nb_xIr_ySi_z$, $Nb_xIr_yN_z$, $Nb_xIr_yC_z$, $Nb_xIr_yO_z$, $Nb_xPt_ySi_z$, $Nb_xPt_yN_z$, $Nb_xPt_yC_z$, $Nb_xP t_yO_z$, $Nb_xPd_ySi_z$, $Nb_xPd_yN_z$, $Nb_xPd_yC_z$, $Nb_xPd_yO_z$, $Ir_xMo_ySi_z$, $Ir_xMo_yN_z$, $Ir_xMo_yC_z$, $Ir_xMo_yO_z$, $Ir_xTa_ySi_z$, $Ir_xTa_yN_z$, $Ir_xTa_yC_z$, $Ir_xTa_yO_z$, $Ir_xSb_ySi_z$, $Ir_xSb_yN_z$, $Ir_xSb_yC_z$, $Ir_xSb_yO_z$, $Ir_xTc_ySi_z$, $Ir_xTc_yN_z$, $Ir_xTc_yC_z$, $Ir_xPt_ySi_z$, $Ir_xPt_yN_z$, $Ir_xP t_yC_z$, $Ir_xPt_yO_z$, $Ir_xPd_ySi_z$, $Ir_xPd_yN_z$, $Ir_xPd_yC_z$, $Ir_xPd_yO_z$, $Pt_xMo_ySi_z$, $Pt_xMo_yN_z$, $Pt_xMo_yC_z$, $Pt_xMo_yO_z$, $Pt_xTa_ySi_z$, $Pt_xTa_yN_z$, $Pt_xTa_yC_z$, $Pt_xTa_yO_z$, $Pt_xSb_ySi_z$, $Pt_xSb_yN_z$, $Pt_xSb_yC_z$, $Pt_xSb_yO_z$, $Pt_xTc_ySi_z$, $Pt_xTc_yN_z$, $Pt_xTc_yC_z$, $Pt_xPd_ySi_z$, $Pt_xP d_yN_z$, $Pt_xPd_yC_z$, $Pt_xPd_yO_z$, $Pd_xMo_ySi_z$, $Pd_xMo_yN_z$, $Pd_xMo_yC_z$, $Pd_xMo_yO_z$, $Pd_xTa_ySi_z$, $Pd_xTa_yN_z$, $Pd_xTa_yC_z$, $Pd_xTa_yO_z$, $Pd_xSb_ySi_z$, $Pd_xSb_yN_z$, $Pd_xSb_yC_z$, $Pd_xSb_yO_z$, $Pd_xT c_ySi_z$, $Pd_xTc_yN_z$, $Pd_xTc_yC_z$, and any variations thereof. In one or more embodiments, the alloy of the two or more second elements includes other compounds having the general formula of $A_xB_yC_z$ comprising three elements.

In one or more embodiments, the alloy of the two or more first elements having the general formula of $A_xB_yC_z$ comprising three elements and the alloy of the two or more second elements having the general formula of $A_xB_yC_z$ comprising three elements may form alloys including one or more first elements and one or more second elements.

In one or more embodiments, each of the alloy of the two or more first elements and the alloy of the two or more second elements has a general formula of $A_xB_yC_z$ comprising three elements have a bond strength between the two or more first elements and the two or more second elements. In one or more embodiments, the bond strength is at least 250 kJ. In one or more embodiments, the bond strength is at least 200 kJ, at least 150 kJ, at least 100 kJ or at least 50 kJ.

Because most materials absorb light at extreme ultraviolet wavelengths, the optical elements used are reflective instead of the transmissive as used in other lithography systems. The multilayer reflective stack 306 forms a reflective structure by having alternating thin layers of materials with different optical properties to create a Bragg reflector or mirror.

The multilayer reflective stack 306 is formed in a variety of ways. In an embodiment, the first layer 312 and the second layer 314 are formed with magnetron sputtering, ion sputtering systems, pulsed laser deposition, cathode arc deposition, or a combination thereof.

In an illustrative embodiment, the multilayer reflective stack 306 is formed using a physical vapor deposition technique, such as magnetron sputtering. In an embodiment, the first layer 312 and the second layer 314 of the multilayer reflective stack 306 have the characteristics of being formed by the magnetron sputtering technique including precise thickness, low roughness, and clean interfaces between the layers. In an embodiment, the first layer 312 and the second layer 314 of the multilayer reflective stack 306 have the characteristics of being formed by the physical vapor deposition including precise thickness, low roughness, and clean interfaces between the layers.

In one or more embodiments, the multilayer reflective stack 306 has a roughness that is reduced compared to a multilayer reflective stack that does not include at least one of the alloy, the nitride, the carbide, the oxide, or the silicide of the first layer 312, or at least one of the alloy, the nitride, the carbide, the oxide, or the silicide of the second layer 314.

In one or more embodiments, a multilayer reflective stack that does not include at least one of the alloy, the nitride, the carbide, the oxide, or the silicide of the first layer 312, or at least one of the alloy, the nitride, the carbide, the oxide, or the silicide of the second layer 314 has a roughness of greater than 0.3 nm.

In one or more embodiments, the multilayer reflective stack 306 having at least one of the alloy, the nitride, the carbide, the oxide, or the silicide of the first layer 312, or at least one of the alloy, the nitride, the carbide, the oxide, or the silicide of the second layer 314 has a roughness in a range from about 0.15 nm to about 0.30 nm, from about 0.16 nm to about 0.29 nm, from about 0.17 nm to about 0.28 nm, from about 0.18 nm to about 0.27 nm, from about 0.19 nm to about 0.26 nm, from about 0.20 nm to about 0.25 nm, from about 0.21 nm to about 0.24 nm, or from about 0.22 nm to about 0.23 nm.

In an embodiment, each of the alternating layers has dissimilar optical constants for the extreme ultraviolet light 112. The alternating layers provide a resonant reflectivity when the period of the thickness of the alternating layers is one half the wavelength of the extreme ultraviolet light 112. In an embodiment, for the extreme ultraviolet light 112 at a wavelength of 13 nm, the alternating layers are about 6.5 nm thick. It is understood that the sizes and dimensions provided are within normal engineering tolerances for typical elements.

The physical dimensions of the layers of the multilayer reflective stack 306 formed using the physical vapor deposition technique is precisely controlled to increase reflectivity. The thickness of the layers dictates the peak reflectivity wavelength of the extreme ultraviolet reflective element. If the thickness of the layers is incorrect, the reflectivity at the desired wavelength 13.5 nm is reduced. In one or more embodiments, each of the first layer 312 and the second layer 314 has a thickness in a range of from about 2 nm to about 5 nm. In one or more embodiments, each of the first layer 312 and the second layer 314 has a thickness in a range of from about 2.5 nm to about 4.5 nm or in a range from about 3 nm to about 4 nm. In one or more embodiments, the thickness of the first layer 312 and the thickness of the second layer 314 are different.

In one or more embodiments, each pair of the alternating layers 316 of the multilayer reflective stack 306 has a thickness in a range from about 5 nm to about 10 nm. In one or more embodiments, each pair of the alternating layers 316 of the multilayer reflective stack 306 has a thickness in a range from about 6 nm to about 9 nm or from about 7 nm to about 8 nm.

In one or more embodiments, the multilayer reflective stack 306 has a thickness in a range from about 150 nm to about 400 nm. In one or more embodiments, the multilayer reflective stack 306 has a thickness in a range from about 175 nm to about 375 nm, from about 200 nm to about 350 nm, from about 225 nm to about 325 nm, or from about 250 nm to about 300 nm.

In an embodiment, the multilayer reflective stack 306 has a reflectivity of greater than 60%. In an embodiment, the multilayer reflective stack 306 formed using physical vapor deposition has a reflectivity in a range of 66%-67%. In one or more embodiments, forming the capping layer 308 over the multilayer reflective stack 306 formed with harder materials improves reflectivity. In some embodiments, reflectivity greater than 70% is achieved using low roughness layers, clean interfaces between layers, improved layer materials, or a combination thereof.

Referring now to FIG. 5, an embodiment of an extreme ultraviolet reflective element 402 is shown. In one or more embodiments, the extreme ultraviolet reflective element 402 is the EUV mask blank 204 of FIG. 3 or the extreme ultraviolet mirror 205 of FIG. 3. The EUV mask blank 204 and the extreme ultraviolet mirror 205 are structures for reflecting the extreme ultraviolet light 112 of FIG. 2. The EUV mask blank 204 is used to form the EUV reflective mask 106 shown in FIG. 2.

In one or more embodiments, the extreme ultraviolet reflective element 402 includes a substrate 404, a multilayer reflective stack 406, and a capping layer 408. In one or more embodiments, the extreme ultraviolet mirror 205 is used to form reflecting structures for use in the condenser 104 of FIG. 2 or the optical reduction assembly 108 of FIG. 2.

In one or more embodiments, the extreme ultraviolet reflective element 402, which in some embodiments is an EUV mask blank 204, includes the substrate 404, the multilayer reflective stack 406 comprises a plurality of pairs of alternating layers comprising a first layer 412 and a second layer 416, an interface layer 414 between the first layer 412 and the second layer 416, the capping layer 408, and an absorber layer 410 on the capping layer 408. The extreme ultraviolet reflective element 402, in some embodiments, is an EUV mask blank 204, which is used to form the EUV reflective mask 106 of FIG. 2 by patterning the absorber layer 410 with the layout of the circuitry required. In one or more embodiments, the interface layer 414 reduces the roughness of the second layer 416 to facilitate growth of a smooth first layer 412 on top of the second layer 414 as a multilayer stack of alternating first layers 412 and second layers 416 are formed with the interface layer 414 formed between and functioning as a smoothing layer. In one or more embodiments, roughness reduction of the multilayer stack increases reflectance of multilayer and enhance bandwidth of reflection.

In one or more embodiments, the multilayer reflective stack 406 is a structure that is reflective to the extreme ultraviolet light 112. In one or more embodiments, the multilayer reflective stack 406 comprises a plurality of pairs of alternating layers comprising a first layer 412 and a second layer 416. In one or more embodiments, the multilayer reflective stack 406 comprises an interface layer 414 between the first layer 412 and the second layer 416.

In one or more embodiments, the first layer 412, the second layer 416 and the interface layer 414 form a group 418 of reflective layers. In one or more embodiments, the multilayer reflective stack 406 has 20-60 groups 418 of reflective layers.

In one or more embodiments, the first layer 412 includes a first element selected from the group consisting of Si, B, Al, Mg, Zr, Ba, Nb, Ti, Gd, Y, and Ca. In one or more embodiments, the first layer 412 includes an alloy of two or more of the first elements, a nitride of the first element, a carbide of the first element, an oxide of the first element, and a silicide of B, Al, Mg, Zr, Ba, Nb, Ti, Gd, Y, and Ca.

In one or more embodiments, the second layer 416 includes a second element selected from the group consisting of Ru, Mo, Ta, Sb, Tc, Nb, Ir, Pt, and Pd. In one or more embodiments, the second layer 416 includes an alloy of two or more of the second elements, a nitride of the second element, a carbide of the second element, an oxide of the second element, and a silicide of the second element.

In one or more embodiments, the multilayer reflective stack 406 comprises an interface layer 414 between the first layer 412 and the second layer 416. In one or more embodiments, the interface layer 414 includes an interface element selected from the group consisting of Si, B, C, Al, Mo, Ru, an alloy of the interface element, a nitride of the interface element, a carbide of the interface element, an oxide of the interface element, and a silicide of the interface element. In one or more embodiments, when the interface layer 414 comprises Si and the first layer 412 comprises Si, properties of the interface layer 414 are different than properties of the first layer 412. In one or more embodiments, when the interface layer 414 comprises Ru and the second layer 416 comprises Ru, properties of the interface layer 414 are different than properties of the second layer 416. In one or more embodiments, when the interface layer 414 comprises Mo and the second layer 416 comprises Mo, properties of the interface layer 414 are different than properties of the second layer 416.

In one or more embodiments, the alloy of the interface elements has a general formula of $A_xB_y$ comprising two elements where the sum of x and y is equal to 1. In one or more embodiments, the general formula of $A_xB_y$ includes one or more of $A_{0.1}B_{0.9}$, $A_{0.2}B_{0.8}$, $A_{0.3}B_{0.7}$, $A_{0.4}B_{0.6}$, $A_{0.5}B_{0.5}$, $A_{0.6}B_{0.4}$, $A_{0.7}B_{0.3}$, $A_{0.8}B_{0.2}$, and $A_{0.9}B_{0.1}$. In one or more embodiments, x is from 0.5 to 0.98. In one or more embodiments where x is from 0.5 to 0.98, y is from 0.02 to 0.5.

In one or more embodiments, examples of the alloy of the interface elements having the general formula of $A_xB_y$ comprising two elements include, but are not limited to, one or more of $Si_xN_y$, $Si_xC_y$, $Si_xO_y$, $B_xSi_y$, $B_xN_y$, $B_xC_y$, $B_xO_y$, $C_xSi_y$, $C_xN_y$, $C_xO_y$, $Al_xN_y$, $Al_xSi_y$, $Al_xC_y$, $Al_xO_y$, $Si_xB_y$, $Si_xAl_y$, $B_xC_y$, $B_xAl_y$, $C_xAl_y$, $Mo_xSi_y$, $Mo_xN_y$, $Mo_xC_y$, $Mo_xO_y$, $Ru_xSi_y$, $Ru_xN_y$, $Ru_xC_y$, $Ru_xO_y$, $Mo_xRu_y$, and any variations thereof. In one or more embodiments, the alloy of the interface elements includes other compounds having the general formula of $A_xB_y$ comprising two elements.

In one or more embodiments, the alloy of the two or more first elements having the general formula of $A_xB_y$ comprising two elements, the alloy of the two or more second elements having the general formula of $A_xB_y$ comprising two elements, and the alloy of the interface elements having the general formula of $A_xB_y$ comprising two elements may form alloys including one or more first elements, one or more second elements, and one or more interface elements.

In one or more embodiments, the alloy of the interface elements has a general formula of $A_xB_yC_z$ comprising three elements where the sum of x, y, and z is equal to 1. In one or more embodiments, the general formula of $A_xB_yC_z$ includes one or more of, $A_{0.1}B_{0.45}C_{0.45}$, $A_{0.2}B_{0.4}C_{0.4}$, $A_{0.3}B_{0.35}C_{0.35}$, $A_{0.4}B_{0.3}C_{0.3}$, $A_{0.5}B_{0.25}C_{0.25}$, $A_{0.6}B_{0.2}C_{0.2}$, $A_{0.7}B_{0.2}C_{0.1}$, $A_{0.8}B_{0.1}C_{0.1}$, $A_{0.9}B_{0.5}C_{0.05}$, $A_{0.45}B_{0.1}C_{0.45}$, $A_{0.4}B_{0.2}C_{0.4}$, $A_{0.35}B_{0.3}C_{0.35}$, $A_{0.3}B_{0.4}C_{0.3}$, $A_{0.25}B_{0.5}C_{0.25}$, $A_{0.2}B_{0.6}C_{0.2}$, $A_{0.2}B_{0.7}C_{0.1}$, $A_{0.1}B_{0.8}C_{0.1}$, $A_{0.05}B_{0.9}C_{0.05}$, $A_{0.45}B_{0.45}C_{0.1}$, $A_{0.4}B_{0.4}C_{0.2}$, $A_{0.35}B_{0.35}C_{0.3}$, $A_{0.3}B_{0.3}C_{0.4}$, $A_{0.25}B_{0.25}C_{0.5}$, $A_{0.2}B_{0.2}C_{0.6}$, $A_{0.1}B_{0.2}C_{0.7}$, $A_{0.1}B_{0.1}C_{0.8}$, $A_{0.05}B_{0.05}C_{0.9}$. In one or more embodiments, x is from 0.5 to 0.98. In one or more embodiments x is from 0.5 to 0.98, y is from 0.02 to 0.5.

In one or more embodiments, examples of the alloy of the interface elements having the general formula of $A_xB_yC_z$ comprising three elements include, but are not limited to one or more of $Si_xB_yN_z$, $Si_xB_yC_z$, $Si_xB_yO_z$, $Si_xC_yN_z$, $Si_xC_yO_z$, $Si_xAl_yO_zSi_xAl_yN_z$, $Si_xAl_yC_z$, $B_xC_ySi_z$, $B_xC_yN_z$, $B_xC_yO_z$, $B_xAl_ySi_z$, $B_xAl_yN_z$, $B_xAl_yC_z$, $B_xAl_yO_z$, $C_xAl_ySi_z$, $C_xAl_yN_z$, $C_xAl_yO_z$, $Mo_xB_yN_z$, $Mo_xB_yC_z$, $Mo_xB_yO_z$, $Mo_xC_yN_z$, $Mo_xC_yO_z$, $Mo_xAl_yO_zMo_xAl_yN_z$, $Mo_xAl_yC_z$, $Mo_xRu_ySi_z$, $Mo_xRu_yN_z$, $Mo_xRu_yC_z$, $Mo_xRu_yO_z$, $Ru_xB_yN_z$, $Ru_xB_yC_z$, $Ru_xB_yO_z$, $Ru_xC_yN_z$, $Ru_xC_yO_z$, $Ru_xAl_yO_z$, $Ru_xAl_yN_z$, $Ru_xAl_yC_z$, and any variations thereof. In one or more embodiments, the alloy of the interface elements includes other compounds having the general formula of $A_xB_yC_z$ comprising three elements.

In one or more embodiments, the alloy of the two or more first elements having the general formula of $A_xB_yC_z$ comprising three elements, the alloy of the two or more second elements having the general formula of $A_xB_yC_z$ comprising three elements, and the alloy of the interface elements having the general formula of $A_xB_yC_z$ comprising three elements may form alloys including one or more first elements, one or more second elements, and one or more interface elements.

In one or more embodiments, each of the alloy of the two or more first elements, the alloy of the two or more second elements, and the alloy of the interface elements having general formula of $A_xB_yC_z$ comprising three elements have a bond strength between the two or more first elements, the two or more second elements, and the interface elements. In one or more embodiments, the bond strength is at least 250 kJ. In one or more embodiments, the bond strength is at least 200 kJ, at least 150 kJ, at least 100 kJ or at least 50 kJ.

In one or more embodiments, the bond strength between each of the alloy of the two or more first elements, the alloy of the two or more second elements, and the alloy of the interface elements is greater than a bond strength between an alloy of the two or more first elements and the alloy of the two or more second elements not having an alloy of the interface elements.

In one or more embodiments, each of the first layer 412 and the second layer 416 has a thickness in a range of from about 2 nm to about 5 nm. In one or more embodiments, each of the first layer 412 and the second layer 416 has a thickness in a range of from about 2.5 nm to about 4.5 nm or in a range from about 3 nm to about 4 nm. In one or more embodiments, the thickness of the first layer 412 and the thickness of the second layer 416 are different.

In one or more embodiments, the interface layer 414 has a thickness in a range of from about 0 nm to about 1.3 nm. In one or more embodiments, the interface layer 414 has a thickness in a range of from about 0.1 nm to about 1.3 nm, from about 0.2 nm to about 1.2 nm, from about 0.3 nm to about 1.1 nm, from about 0.4 nm to about 1.0 nm, from about 0.5 nm to about 0.9 nm, or from about 0.6 nm to about 0.8 nm.

In one or more embodiments, each group 418 of reflective layers of the multilayer reflective stack 406 has a thickness in a range from about 5 nm to about 10 nm. In one or more embodiments, each group 418 of reflective layers of the multilayer reflective stack 406 has a thickness in a range from about 6 nm to about 9 nm or from about 7 nm to about 8 nm. In one or more embodiments, the multilayer reflective stack 406 has 40 groups 418 of reflective layers, each group 418 having a thickness. In one or more embodiments, each group 418 of reflective layers has a same thickness. In one or more embodiments, each group 418 of reflective layers has a different thickness.

In one or more embodiments, the multilayer reflective stack 406 has a thickness in a range from about 150 nm to about 450 nm. In one or more embodiments, the multilayer reflective stack 406 has a thickness in a range from about 175 nm to about 425 nm, from about 200 nm to about 400 nm, from about 225 nm to about 375 nm, from about 250 nm to about 350 nm, or from about 275 nm to about 325 nm.

In one or more embodiments, the multilayer reflective stack 406 has a roughness that is reduced compared to a multilayer reflective stack that does not include at least one of the alloy, the nitride, the carbide, the oxide, or the silicide of the first layer 412, at least one of the alloy, the nitride, the carbide, the oxide, or the silicide of the second layer 416, or at least one of the alloy, the nitride, the carbide, the oxide, or the silicide of the interface layer 414.

In one or more embodiments, a multilayer reflective stack that does not include at least one of the alloy, the nitride, the carbide, the oxide, or the silicide of the first layer 412, at least one of the alloy, the nitride, the carbide, the oxide, or the silicide of the second layer 416, or at least one of the alloy, the nitride, the carbide, the oxide, or the silicide of the interface layer 414 has a roughness of greater than 0.3 nm.

In one or more embodiments, the multilayer reflective stack 406 that includes at least one of the alloy, the nitride, the carbide, the oxide, or the silicide of the first layer 412, at least one of the alloy, the nitride, the carbide, the oxide, or the silicide of the second layer 416, or at least one of the alloy, the nitride, the carbide, the oxide, or the silicide of the interface layer 414 has a roughness in a range from about 0.15 nm to about 0.30 nm, from about 0.16 nm to about 0.29 nm, from about 0.17 nm to about 0.28 nm, from about 0.18 nm to about 0.27 nm, from about 0.19 nm to about 0.26 nm, from about 0.20 nm to about 0.25 nm, from about 0.21 nm to about 0.24 nm, or from about 0.22 nm to about 0.23 nm.

In one or more embodiments, the interface layer 414 has a density that is at least 95% of a density of the multilayer stack 406. In one or more embodiments, the interface layer 414 has a density that is at least 85%, at least 75%, at least 65% or at least 50% of a density of the multilayer stack 406.

In one or more embodiments, the interface layer 414 is thermally stable at a temperature of at least 1400° C. In one or more embodiments, the interface layer is thermally stable at a temperature of at least 1200° C., at least 1000° C., at least 800° C., at least 600° C. or at least 400° C.

Referring again to FIGS. 4 and 5, the capping layer is a protective layer allowing the transmission of the extreme ultraviolet light 112. In one or more embodiments, the capping layer 308 of FIG. 4 and the capping layer 408 of FIG. 5 have the same properties and can be described with reference to either or both of FIG. 4 and FIG. 5. Referring to FIG. 5, the capping layer 408 is formed directly on the multilayer reflective stack 406. In one or more embodiments, the capping layer 408 protects the multilayer reflective stack 406 from contaminants and mechanical damage. In one embodiment, the multilayer reflective stack 406 is sensitive to contamination by oxygen, carbon, hydrocarbons, or a combination thereof. The capping layer 408 according to an embodiment interacts with the contaminants to neutralize them.

In one or more embodiments, the capping layer 408 is an optically uniform structure that is transparent to the extreme ultraviolet light 112. The extreme ultraviolet light 112 passes through the capping layer 408 to reflect off of the multilayer reflective stack 406. In one or more embodiments, the capping layer 408 has a total reflectivity loss of 1% to 2%. In one or more embodiments, each of the different materials has a different reflectivity loss depending on thickness, but all of them will be in a range of 1% to 2%.

In one or more embodiments, the capping layer 408 has a smooth surface. For example, the surface of the capping layer 408 in some embodiments has a roughness of less than 0.2 nm RMS (root mean square measure). In another example, the surface of the capping layer 408 has a roughness of 0.08 nm RMS for a length in a range of 1/100 nm and 1/1 μm. The RMS roughness will vary depending on the range it is measured over. For the specific range of 100 nm to 1 micron that roughness is 0.08 nm or less. Over a larger range the roughness will be higher.

The capping layer 408 is formed by a variety of methods. In an embodiment, the capping layer 408 is formed on or directly on the multilayer reflective stack 406 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. In one or more embodiments, the capping layer 408 has the physical characteristics of being formed by the magnetron sputtering technique including precise thickness, low roughness, and clean interfaces between the layers. In an embodiment, the capping layer 408 has the physical characteristics of being formed by the physical vapor deposition including precise thickness, low roughness, and clean interfaces between the layers.

In one or more embodiments, the capping layer 408 is formed from a variety of materials having a hardness sufficient to resist erosion during cleaning. In one embodiment, ruthenium is used as a capping layer material because it is a good etch stop and is relatively inert under the operating conditions. However, it is understood that in some embodiments, other materials are used to form the capping layer 408. In specific embodiments, the capping layer 408 has a thickness in a range of 2.5 and 5.0 nm.

Referring again to FIGS. 4 and 5, the absorber layer is a layer that absorbs the extreme ultraviolet light 112. In one or more embodiments, the absorber layer 310 of FIG. 4 and the absorber layer 410 of FIG. 5 have the same properties and can be described with reference to either or both of FIG. 4 and FIG. 5. Referring to FIG. 5, the absorber layer 410 is used to form the pattern on the EUV reflective mask 106 by providing areas that do not reflect the extreme ultraviolet light 112. The absorber layer 410, according to one or more embodiments, comprises a material having a high absorption coefficient for a particular frequency of the extreme ultraviolet light 112, such as about 13.5 nm. In an embodiment, the absorber layer 410 is formed directly on the capping layer 408, and the absorber layer 410 is etched using a photolithography process to form the pattern of the EUV reflective mask 106.

According to one or more embodiments, the extreme ultraviolet reflective element 402, such as the extreme ultraviolet mirror 205, is formed with the substrate 404, the multilayer reflective stack 406, and the capping layer 408. The extreme ultraviolet mirror 205 has an optically flat surface and efficiently and uniformly reflects the extreme ultraviolet light 112.

According to one or more embodiments, the extreme ultraviolet reflective element 402, such as the EUV mask blank 204, is formed with the substrate 404, the multilayer reflective stack 406, the capping layer 408, and the absorber layer 410. The mask blank 204 has an optically flat surface and efficiently and uniformly reflects the extreme ultraviolet light 112. In an embodiment, the mask pattern 114 is formed with the absorber layer 410 of the EUV mask blank 204.

According to one or more embodiments, forming the absorber layer 410 over the capping layer 408 increases reliability of the EUV reflective mask 106. The capping layer 408 acts as an etch stop layer for the absorber layer 410. When the mask pattern 114 of FIG. 2 is etched into the absorber layer 410, the capping layer 408 beneath the absorber layer 410 stops the etching action to protect the multilayer reflective stack 406. In one or more embodiments, the absorber layer 410 is etch selective to the capping layer 408. In some embodiments, the capping layer 408 comprises ruthenium, and the absorber layer 410 is etch selective to ruthenium.

In one or more embodiments, the absorber layer 410 has an "n" value of less than 0.92, which provides a range from about 180 degrees to about 220 degrees phase shift. The "n" value of less than about 0.92 improves the normalized image log slope (NILS) and mitigates 3D effects. As used in the specification and appended claims, "normalized image log slope (NILS)" refers to a metric describing the lithographic quality of an aerial image. As used in the specification and appended claims, "n" or "n value" refers to an index of refraction. The index of refraction is a measurement of the bending of a ray of light when passing from one medium into another. The low "n" value improves the NILS and mitigates 3D effects.

In an embodiment, the absorber layer 410 has a thickness of less than about 55 nm, including less than about 50 nm, less than about 45 nm, less than about 40 nm, less than about 35 nm, less than about 30 nm, less than about 25 nm, less than about 20 nm, less than about 15 nm, less than about 10 nm, less than about 5 nm, less than about 1 nm, or less than about 0.5 nm. In other embodiments, the absorber layer 310 has a thickness in a range of about 0.5 nm to about 55 nm, including a range of about 1 nm to about 54 nm, 1 nm to about 50 nm, and 15 nm to about 50 nm.

Figure 6:
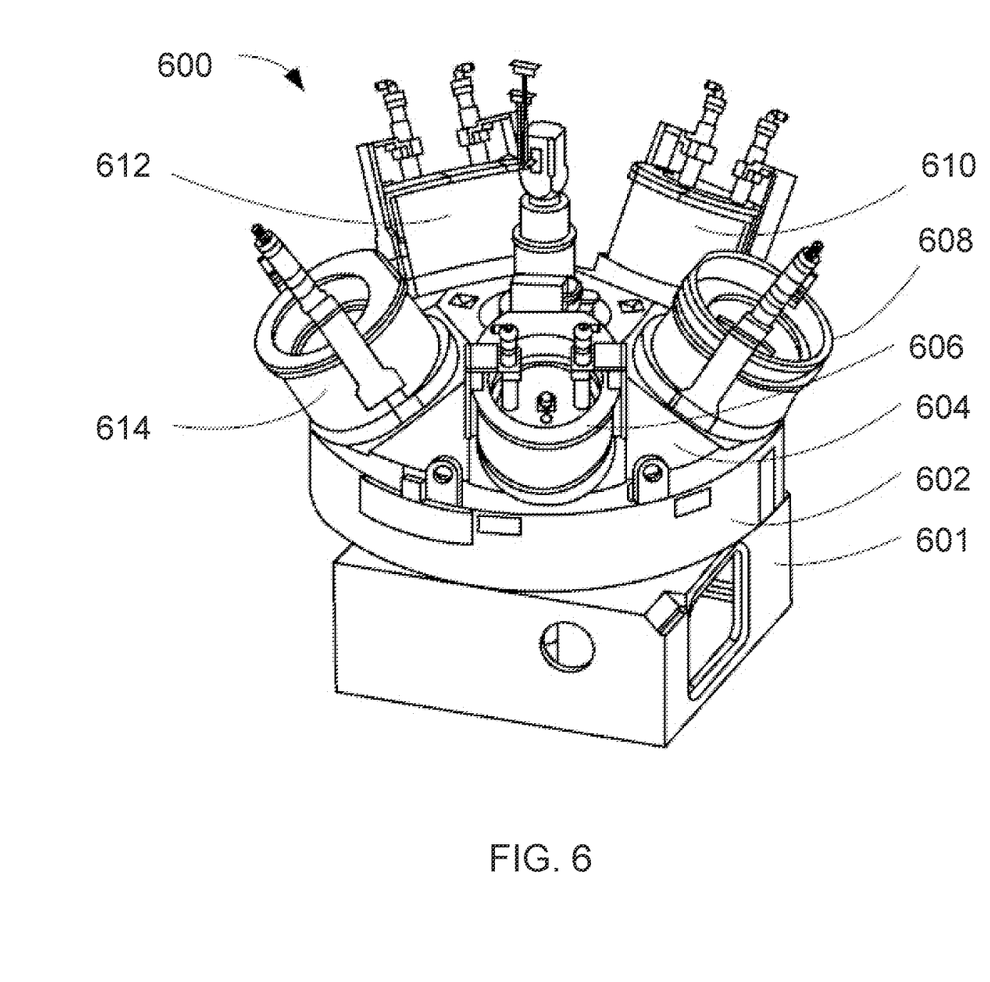
FIG. 6 illustrates an embodiment of a multi-cathode physical deposition chamber.

Referring now to FIG. 6, an upper portion of a multi-cathode source chamber 600 is shown in accordance with an embodiment. The multi-cathode chamber 600 includes a base structure 601 with a cylindrical body portion 602 capped by a top adapter 604. The top adapter 604 has provisions for a number of cathode sources, such as cathode sources 606, 608, 610, 612, and 614, positioned around the top adapter 604. The cathode sources 606, 608, 610, 612, and 614 according to one or more embodiments comprise different materials as described herein to form the multilayer reflective stack.

In some embodiments, the multi-cathode source chamber 600 is part of the system shown in FIG. 3. In an embodiment, an extreme ultraviolet (EUV) mask blank production system comprises a substrate handling vacuum chamber for creating a vacuum, a substrate handling platform, in the vacuum, for transporting a substrate loaded in the substrate handling vacuum chamber, and multiple sub-chambers, accessed by the substrate handling platform, for forming an EUV mask blank, including a multilayer stack of reflective layers on the substrate, the multilayer stack including a plurality of reflective layer pairs, a capping layer on the multilayer stack of reflective layers, and an absorber layer on the capping layer. The system is used to make the EUV mask blanks shown with respect to FIG. 4 or FIG. 5 and have any of the properties described with respect to the EUV mask blanks described with respect to FIGS. 4-5.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely exemplary. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An extreme ultraviolet (EUV) mask blank comprising:
a multilayer reflective stack on a substrate, the multilayer reflective stack comprising a plurality of pairs of alternating layers comprising a first layer and a second layer, the first layer including a first element selected from the group consisting of Si, B, Al, Mg, Zr, Ba, Nb, Ti, Gd, Y, and Ca; and the second layer including a second element selected from the group consisting of Ru, Mo, Ta, Sb, Tc, Nb, Ir, Pt, and Pd wherein
the first layer comprises at least one of: an alloy of two or more of the first elements, a nitride of the first element, a carbide of the first element, an oxide of the first element, and a silicide of B, Al, Mg, Zr, Ba, Nb, Ti, Gd, Y, and Ca; or
the second layer comprises at least one of an alloy of two or more of the second elements, a nitride of the second element, a carbide of the second element, an oxide of the second element, and a silicide of the second element;
a capping layer on the multilayer reflective stack; and
an absorber layer on the capping layer.

2. The EUV mask blank of claim 1, wherein the multilayer reflective stack has a roughness that is reduced compared to a multilayer reflective stack that does not include at least one of the alloy, the nitride, the carbide, the oxide, or the silicide of the first layer, or at least one of the alloy, the nitride, the carbide, the oxide, or the silicide of the second layer.

3. The EUV mask blank of claim 2, wherein each of the first layer and the second layer has a thickness in a range of from about 2 nm to about 5 nm.

4. The EUV mask blank of claim 3, wherein each pair of the alternating layers of the multilayer reflective stack has a thickness in a range from about 5 nm to about 10 nm.

5. The EUV mask blank of claim 4, wherein the multilayer reflective stack has a thickness in a range from about 150 nm to about 450 nm.

6. The EUV mask blank of claim 1, wherein each of the alloy of the two or more first elements and the alloy of the two or more second elements has a general formula of $A_xB_yC_z$ comprising two elements where the sum of x and y is equal to 1.

7. The EUV mask blank of claim 1, wherein each of the alloy of the two or more first elements and the alloy of the two or more second elements has a general formula of $A_xB_yC_z$ comprising three elements where the sum of x, y, and z is equal to 1.

8. An extreme ultraviolet (EUV) mask blank comprising:
a multilayer reflective stack on a substrate, the multilayer reflective stack comprising a plurality of pairs of alternating layers comprising a first layer and a second layer, the first layer including a first element selected from the group consisting of Si, B, Al, Mg, Zr, Ba, Nb, Ti, Gd, Y, and Ca; and the second layer including a second element selected from the group consisting of Ru, Mo, Ta, Sb, Tc, Nb, Ir, Pt, and Pd;
an interface layer between the first layer and the second layer, the interface layer including an interface element selected from the group consisting of Si, B, C, Al, Mo, Ru, an alloy of the interface element, a nitride of the interface element, a carbide of the interface element, an oxide of the interface element, and a silicide of the interface element, wherein when the interface layer comprises Si and the first layer comprises Si, properties of the interface layer are different than properties of the first layer, and wherein the interface layer reduces roughness of the multilayer reflective stack compared to a multilayer reflective stack that does not include an interface layer between the first layer and the second layer;
a capping layer on the multilayer reflective stack; and
an absorber layer on the capping layer.

9. The EUV mask blank of claim 8, wherein each of the first layer and the second layer has a thickness in a range of from about 2 nm to about 5 nm.

10. The EUV mask blank of claim 8, wherein the interface layer has a thickness in a range of from about 0 nm to about 1.3 nm.

11. The EUV mask blank of claim 8, wherein each group of reflective layers of the multilayer reflective stack has a thickness in a range from about 5 nm to about 10 nm.

12. The EUV mask blank of claim 8, wherein the multilayer reflective stack has a thickness in a range from about 150 nm to about 450 nm.

13. The EUV mask blank of claim 8, wherein the multilayer reflective stack has a roughness that is reduced compared to a multilayer reflective stack that does not include at least one of the alloy, the nitride, the carbide, the oxide, or the silicide of the first layer, at least one of the alloy, the nitride, the carbide, the oxide, or the silicide of the second layer, or at least one of the alloy, the nitride, the carbide, the oxide, or the silicide of the interface layer.

14. A method of reducing roughness of a multilayer reflective stack, the method comprising:
forming multilayer reflective stack on a substrate, the multilayer reflective stack comprising a plurality of pairs of alternating layers comprising a first layer and a second layer, the first layer including a first element selected from the group consisting of Si, B, Al, Mg, Zr, Ba, Nb, Ti, Gd, Y, and Ca; and the second layer including a second element selected from the group consisting of Ru, Mo, Ta, Sb, Tc, Nb, Ir, Pt, and Pd;
forming in at least one of the first layer and the second layer:
at least one of an alloy of two or more of the first elements, a nitride of the first element, a carbide of the first element, an oxide of the first element, and a silicide of B, Al, Mg, Zr, Ba, Nb, Ti, Gd, Y and Ca;
at least one of an alloy of two or more of the second elements, a nitride of the second element, a carbide of the second element, an oxide of the second element, and a silicide of the second element;
forming a capping layer on the multilayer reflective stack; and
forming an absorber layer on the capping layer.

15. The method of claim 14, further comprising forming an interface layer between the first layer and the second layer, the interface layer including an interface element selected from the group consisting of Si, B, C, Al, Mo, Ru, an alloy of the interface element, a nitride of the interface element, a carbide of the interface element, an oxide of the interface element, and a silicide of the interface element, wherein when the interface layer comprises Si and the first layer comprises Si, properties of the interface layer are different than properties of the first layer.

16. The method of claim 14, wherein each of the first layer and the second layer has a thickness in a range of from about 2 nm to about 5 nm.

17. The method of claim 15, wherein the interface layer has a thickness in a range of from about 0 nm to about 1.3 nm.

18. The method of claim 14, wherein the multilayer reflective stack has a thickness in a range from 150 nm to about 450 nm.

19. The method of claim 14, wherein each of the alloy of the two or more first elements and the alloy of the two or more second elements has one or more of a general formula of $A_xB_y$ comprising two elements where the sum of x and y is equal to 1, and a general formula of $A_xB_yC_z$ comprising three elements where the sum of x, y, and z is equal to 1.

20. The method of claim 14, wherein the multilayer reflective stack has a roughness that is reduced compared to a multilayer reflective stack that does not include at least one of the alloy, the nitride, the carbide, the oxide, or the silicide of the first layer, or at least one of the alloy, the nitride, the carbide, the oxide, or the silicide of the second layer.

* * * * *

UNITED STATES PATENT AND TRADEMARK OFFICE
CERTIFICATE OF CORRECTION

PATENT NO. : 11,762,278 B2
APPLICATION NO. : 17/349177
DATED : September 19, 2023
INVENTOR(S) : Vibhu Jindal et al.

Page 1 of 1

It is certified that error appears in the above-identified patent and that said Letters Patent is hereby corrected as shown below:

In the Specification

Column 8, Line 24, replace "$CaO_xO_y$" after "$Ca_xC_y$" and before "$Si_xB_y$" with "$Ca_xO_y$".

In the Claims

Column 18, Line 64, Claim 6, replace "$A_xB_yC_z$" before "comprising" with "$A_xB_y$".

Signed and Sealed this
Seventh Day of November, 2023

Katherine Kelly Vidal
*Director of the United States Patent and Trademark Office*